(12) United States Patent
Lall et al.

(10) Patent No.: US 6,370,071 B1
(45) Date of Patent: Apr. 9, 2002

(54) HIGH VOLTAGE CMOS SWITCH (75) Inventors: Ravindar M. Lall; Robert B. Lefferts, both of Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/660,707

(22) Filed: Sep. 13, 2000

(51) Int. Cl.[7] .................................................. G11C 7/00
(52) U.S. Cl. ..................... 365/205; 365/230.06; 326/81; 327/55
(58) Field of Search ................................... 365/205, 207, 365/208, 154, 156, 230.06, 189.09; 327/55, 213, 333, 434; 326/68, 80, 81

(56) References Cited

U.S. PATENT DOCUMENTS

| | | | | |
|---|---|---|---|---|
| 5,619,150 A | * | 4/1997 | Briner | 327/55 |
| 5,818,257 A | * | 10/1998 | Villa | 326/81 |
| 5,872,476 A | * | 2/1999 | Mihara et al. | 327/333 |
| 5,963,061 A | * | 10/1999 | Briner | 327/55 |
| 6,060,904 A | * | 5/2000 | Shimoda | 326/68 |
| 6,111,429 A | * | 8/2000 | Bertolini | 326/68 |

* cited by examiner

Primary Examiner—David Nelms
Assistant Examiner—Gene N. Auduong (57) ABSTRACT

A high voltage CMOS switch circuit having an arrangement of device connections such that the individual transistor devices are substantially the same size, improving performance while reducing size and providing breakdown protection. The circuit switches a high voltage to the output based on a low voltage input. The circuit is ratio-less and self-biased, capable of operating a very low supply voltage compared to the state of the art.

21 Claims, 5 Drawing Sheets

HIGH VOLTAGE CMOS SWITCH

BACKGROUND OF THE INVENTION

1. Field of the Invention

The present invention relates generally to integrated circuits, more particularly to complementary metal oxide semiconductor integrated circuit switching devices, and more specifically to a ratio-less, high voltage, CMOS, switch for non-volatile memory, address data decoding, integrated circuit devices.

2. Description of Related Art

Complementary metal oxide silicon ("CMOS") technology is a preferred fabrication process for many integrated circuit ("IC") devices, particularly those in which low power consumption and high component density are priorities. Many publications describe the details of common techniques used in the fabrication of integrated circuits that can be generally employed in the fabrication of complex, three-dimensional, IC structures; see e.g., *Silicon Processes*, Vol. 1–3, copyright 1995, Lattice Press, Lattice Semiconductor Corporation (assignee herein), Hillsboro, Oreg. Moreover, the individual steps of such a process can be performed using commercially available IC fabrication machines. The use of such machines and common fabrication step techniques will be referred to hereinafter as simply: "in a known manner." The commonly used term "chip" is used to refer to an entire IC device. As specifically helpful to an understanding of the present invention, approximate technical data are disclosed herein based upon current technology; future developments in this art may call for appropriate adjustments as would be apparent to one skilled in the art.

In programmable non-volatile memory cells, such as row and column address decoder outputs, it is generally known to use a circuit that switches a relatively high voltage to the output based on a relatively low voltage input for an addressed cell. It will be recognized by those skilled in the art that such "switch" circuits (any electronic circuit that reverses and maintains a state, namely HIGH/LOW or 1/0, each time the input power changes) can have many other uses, such as signal level translators, output pad drivers, programming circuits, and the like.

Figure 1:
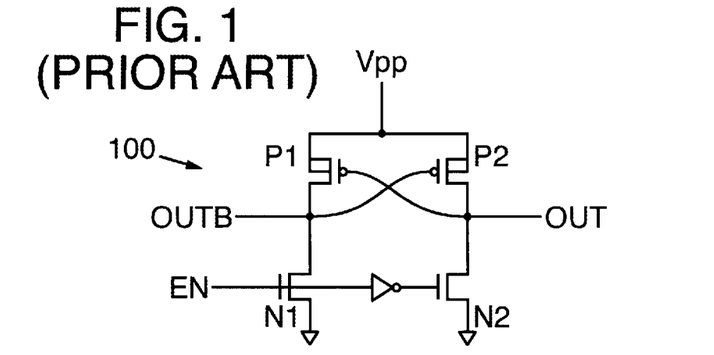
FIG. 1 (Prior Art) is an electrical schematic diagram for a first conventional high voltage CMOS switching circuit.

FIG. 1 (Prior Art) is an electrical schematic of a typical IC, non-volatile memory, address decoder output, high voltage switching circuit 100, "high V switch" for short. Four metal-oxide-silicon field effect transistors ("MOSFET"), N1, N2, P1 (n-well device), P2 (n-well device) and an inverter are used. [It will be recognized by those skilled in the art that all dopant types can be reversed]. The high V switch receives an input Enable signal, "En," having a transition either from LOW-to-HIGH or HIGH-to-LOW (e.g., between a zero volt LOW and a two-and-a-half volt HIGH or other logic power supply voltage, "Vcc," depending on the fabrication process design), and provides an output signal "OUT" that needs to be driven correspondingly (e.g., between a zero volt LOW and a thirteen volt HIGH or other generated fabrication process design level). The power supply to the circuit is a high voltage, "Vpp," generated internally by other known manner circuitry of the IC (not shown), e.g., the desired output level, thirteen volts. In operation, when signal En is LOW, the inverter output, INV, is HIGH and transistor N2 is ON, transistor P1 is ON, transistors N1 is OFF and P2 are OFF (gate and source at Vpp), so OUTB is at Vpp and the signal OUT is switched to LOW. Note that N1 and P1 must be designed in relative size to have a size ratio wherein N1 is a much larger individual device than P1; similarly the size of N2>>P2. Thus, when signal En goes HIGH/Vcc, the inverter output goes LOW and N2 is OFF, N1 being ON overcomes P1, OUTB is pulled LOW, turning ON P2 which feeds back into P1 also trying to shut P1 OFF, P2 being ON is passing Vpp to switch the OUT signal node (and at the same time also turning OFF P1). In other words, to make the signal transition with this conventional circuit, the N1 and N2 devices have to overcome P1 and P2 devices so they must be much larger in design, using valuable IC chip space. Depending on the process and device parameters N1 and N2 may be as much as five times as large as P1 and P2. Thus, this circuit is also relatively slow. Moreover, during this difficult transition, excessive power is used. Furthermore, the individual devices must be built to handle the high voltage without breakdowns (grounded gate (e.g, in FIG. 1 when N1 is OFF, having the gate at LOW and the source grounded, yet the OUT node is at Vpp at the start of an En LOW and INV transition to 1), n-well (e.g., in the p-type devices, the n-well is tied to Vpp), n+/p+ junction breakdowns), such as by having relatively very thick (>250 Angstroms) gate oxide to handle the high voltage levels, complicating fabrication process steps.

It is common to shorthand the system function via a logic table, such as Table 1, also provided for the remaining Figures discussed:

TABLE 1

| En | INV | N1 | P1 | N2 | P2 | OUTB | OUT |
|---|---|---|---|---|---|---|---|
| LOW | 1 | OFF | ON | ON | OFF | Vpp | LOW |
| HI/Vcc | LOW | ON | OFF | OFF | ON | LOW | Vpp |

Figure 2:
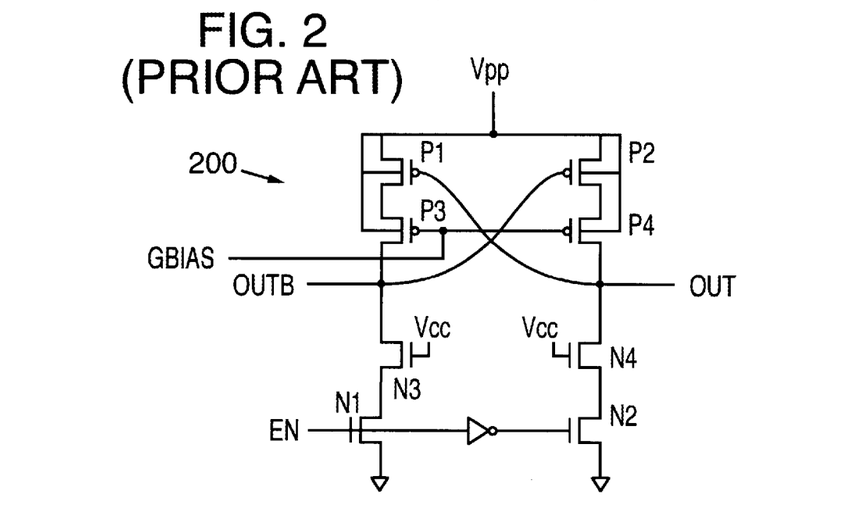
FIG. 2 (Prior Art) is an electrical schematic diagram for a second conventional high voltage CMOS switching circuit.

Another prior art high voltage switch circuit is shown in FIG. 2 (Prior Art). This circuit is designed to handle grounded gate problems via a cascode arrangement of MOSFET transistors. Cascoded N3 and N4 are connected at their respective gates to Vcc. The respective drain electrodes at N1 and N2 never reach Vpp but when the signal OUT node or the signal OUTB node is raised to Vpp, the drain electrodes are only at Vcc–Vtn, where Vt is the threshold voltage for the n-type MOSFETS, thus, the drain-source voltage, Vds, remains smaller than Vpp. Thus grounded gate breakdown is no longer a problem. Obviously, however, even more chip real estate is required than for the circuit of FIG. 1. For the p-channel devices, cascoded P3 and P4 are tied to a gate bias voltage, GBIAS. That bias voltage is strategically selected according to design parameters to prevent grounded gate breakdown in the pull-up side of the circuit. However, to switch the switch, a timing sequence must be implemented, thus complicating design. In other words, initially to decode the correct En signal transition, GBIAS is held at zero volts until an En transition when signal OUTB is HIGH, then raise Vpp and GBIAS levels. Note also that the n-wells of the p-type devices P1–4 are again tied to Vpp, but P3 and P4 are not source-tied to Vpp; therefore, separate n-wells are required, again adding design and fabrication complexity. Note also, the series-coupled extra transistors on both sides of the switch will be an inherently slower reacting circuit. Also this design still requires N-to-P size ratios because each N-stack must overcome the respective P-stack connected in series thereto to flip the switch between HIGH/LOW states. Thus, design and area complexity is a main drawback to this solution to the problems with high voltage CMOS switch circuits.

There is a need for a faster, small, simpler design for a high voltage CMOS switch.

SUMMARY OF THE INVENTION

In its basic aspects, the present invention provides a high voltage CMOS switch including: first devices for signal switching coupled to an input electrode, having a first logic state and a second logic state, and arranged as a parallel-connected, cascode input device and biased at a first electrical potential; and second devices for signal switching, coupled to said first devices and to a second electrical potential greater than said first electrical potential and to an output electrode, and arranged as a parallel-connected cascode output device coupled to said input electrode such that said second devices is pre-biased to said first electrical potential such that switching occurs at the output from said first electrical potential to said second electrical potential without said first devices being required to over-drive said second devices.

In another aspect, the present invention provides a high voltage switch circuit device, including: an input node; a first output node; a second output node; a first source of electrical potential level; a second source of electrical potential level greater than the first source of electrical potential; an inverter connected to the input node; a first cascode, biased by said first source of electrical potential level, connected to said input node; a second cascode biased by said first source of electrical potential, and connected in series via the inverter with the first cascode, the second cascode connected to said output node; a third cascode, biased by a signal on the input node, connected in series with the first cascode, and connecting said second source of electrical potential level to said first output node; a fourth cascode, biased by an output signal of the inverter, connected in series with the second cascode, and connecting said second source of electrical potential level to said second output node, wherein a transition of a signal level between a reference and a second state equal to said first source of electrical potential level on said input node causes a transition on said output node between said first source of electrical potential level and said second source of electrical potential level without said first cascode having to over-drive said third cascode and without said second cascode having to over-drive said fourth cascode.

In another aspect, the present invention provides a memory decoder circuit including a high voltage switch device comprising: first devices for signal switching coupled to an input electrode, having a first logic state and a second logic state, and arranged as a parallel-connected, cascode input device and biased at a first electrical potential; and second devices for signal switching, coupled to said first devices and to a second electrical potential greater than said first electrical potential and to an output electrode, and arranged as a parallel-connected cascode output device coupled to said input electrode such that said second devices is pre-biased to said first electrical potential such that switching occurs at the output from said first electrical potential to said second electrical potential without said first devices being required to over-drive said second devices.

Some of the advantages of the present invention are:
it is a ratio-less MOSFET design;
it has built-in grounded gate breakdown protection when required;
it minimizes chip real estate requirements;
it is a relatively faster switch;
it requires no external, global bias;
it is a self-biased cascode;
it operates a very low Vcc compared to state of the art devices; and
it has a plurality of uses.

The foregoing summary and list of advantages is not intended by the inventor(s) to be an inclusive list of all the aspects, objects, advantages and features of the present invention nor should any limitation on the scope of the invention be implied therefrom. This Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches. Other objects, features and advantages of the present invention will become apparent upon consideration of the following explanation and the accompanying drawings, in which like reference designations represent like features throughout the drawings.

The drawings referred to in this specification should be understood as not being drawn to scale except if specifically annotated.

DESCRIPTION OF THE PREFERRED EMBODIMENT

Reference is made now in detail to a specific embodiment of the present invention, which illustrates the best mode presently contemplated by the inventors for practicing the invention. Alternative embodiments are also briefly described as applicable.

Figure 3:
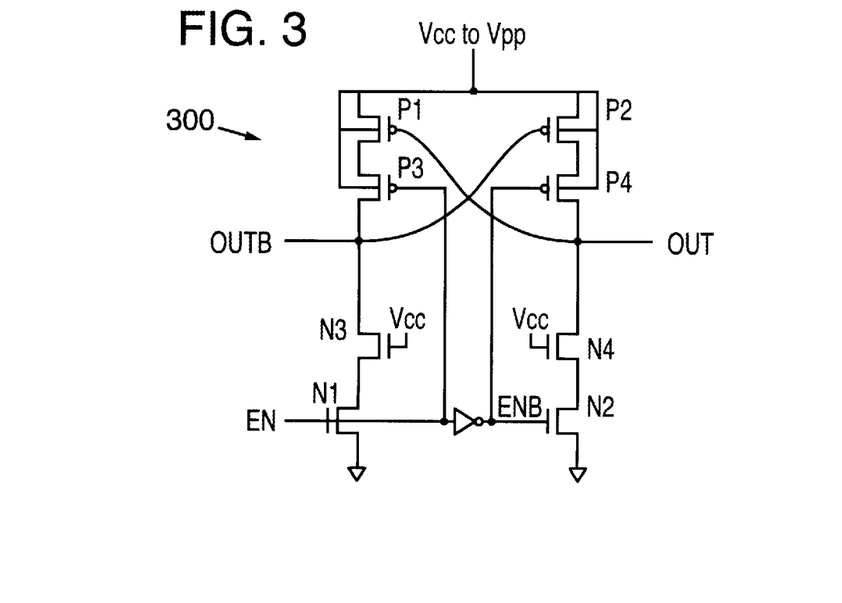
FIG. 3 is an electrical schematic diagram for the present invention.

FIG. 3 is an electrical schematic diagram for the present invention. The layout consists of:

four n-well, thick gate, p-channel MOSFETS P1, P2, P3, P4, with P1 in series with P3 and P2 connected in series with P4, and with the gate of input stage P3 connected to the input signal En and the gate of input stage P4 connected to an inverted input signal Enb (instead of having a GBIAS as shown in FIG. 2);

four thick gate, n-channel MOSFETS N1, N2, N3, N4, where N3 and N4 are series connected to N1 and N2, respectively, as gate cascodes to prevent grounded gate breakdown of N1 and N2; and a thin gate, low voltage CMOS inverter INV connecting input stage N1 and output stage N2.

Switching is accomplished when Vpp=Vcc; in other words, at the high voltage input node, HV, whenever not programming, normally input signal En is at a LOW state, HV is at Vcc. Switching the input signal En to HIGH also triggers a known manner IC voltage pump (not shown) to raise HV to Vpp after the device has switched. That is, the circuit is first switched and then Vpp is pumped up to 13-volts (e.g.). Once switched the output node, HV, follows Vpp as it pumps up from Vcc to 13-volts.

Figure 3A:
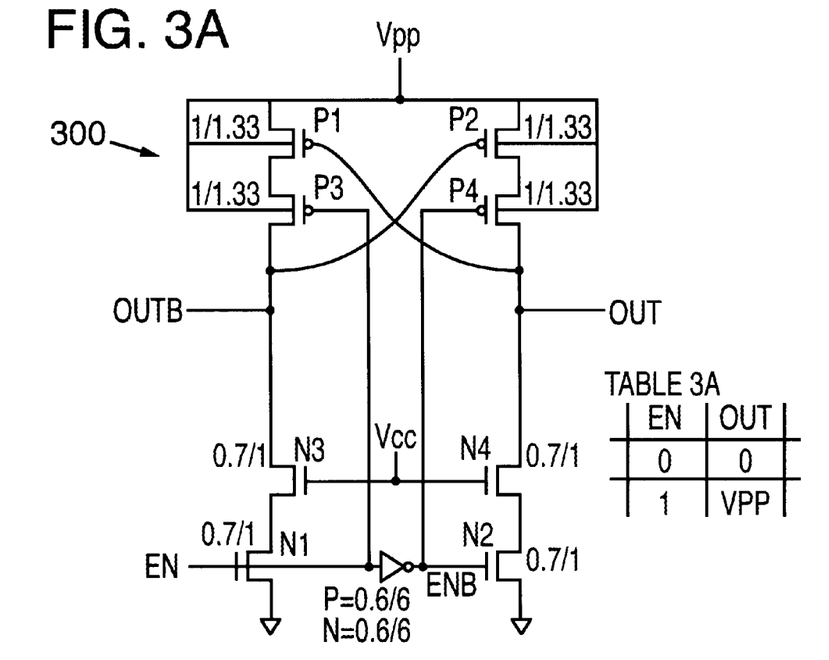
FIG. 3A is an electrical schematic diagram and logic table for the present invention as shown in FIG. 3, demonstrating a specific implementation.

As shown in FIG. 3A, an electrical schematic diagram and logic table, Table 3A, for the present invention high voltage CMOS switch 300 as shown in FIG. 3, demonstrating a specific implementation in standard design units wherein the MOSFET size is substantially ratio-less.

In operation, when input signal En is LOW, steady state, N1 is OFF, and inverter INV output signal EnB is HIGH, so N2 is ON. The output signal is at zero volts as N2 source electrode is at ground potential. P1 is ON and the gate P3 is LOW because it is tied to En, so P3 is ON and the node at OUTB is connected to Vpp. With its gate connected to inverter output signal EnB which is HIGH, P4 is OFF; with its gate connected to signal OUTB which is at Vpp, P2 is OFF. Thus, P4 acts as a gate cascode, protecting P2 from a grounded gate breakdown since its source electrode is coupled to the high voltage Vpp. Therefore, at this steady state condition with En LOW, there is essentially no power being drawn. Also, being coupled at its gate to logic bias Vcc, N3 acts as a cascode to protect N1 from gate breakdown due to the node at OUTB going to Vpp.

When input signal En goes to a logic HIGH, Vcc, inverter INV output signal EnB goes LOW and N1 turns ON. In comparison to FIGS. 1 and 2, when N1 turned ON, the node at OUTB was brought to LOW because having the ratio set where N1 was stronger than P1, N1 drove through P1; now, however, the gate of P3 being tied to input signal En also goes to Vcc, so P3 is shut OFF. With N2 now OFF because the output signal EnB of the inverter INV is LOW, the gate of P4 is coupled to ground, so P4 is ON and conducting. Since the node at OUTB is now LOW, without the need for a large N1 to overcome P3, P2 being coupled at its gate to the node at OUTB turns ON. Thus, with both P2 and P4 conducting, Vpp is coupled to the output node and signal OUT is at Vpp. The respective drain electrodes at N1 and N2 never reach Vpp but when the signal OUTB node or the signal OUT node is raised to Vpp, the drain electrodes are only at Vcc–Vtn, where Vt is the threshold voltage for the n-type MOSFETS and, thus, the voltage, Vds, remains smaller than Vpp. Table 3 represents this logic flow.

Therefore, the functionality of a high voltage switch is accomplished in a substantially ratio-less design (channel width can be slightly adjusted for speed design considerations). Moreover, on the p-channel side of the circuit, grounded gate breakdown is accomplished without a gate bias and complicated timing (see FIG. 2 explanation above). That is, the gate cascode to Vcc (Vpp) for P3 and P4 happens on the side which needs it and not the other. The gate cascode voltage (=Vcc) comes conveniently from En or EnB nodes (i.e., the data) and does not have to be generated globally. Thus, it is switched.

Figure 3B:
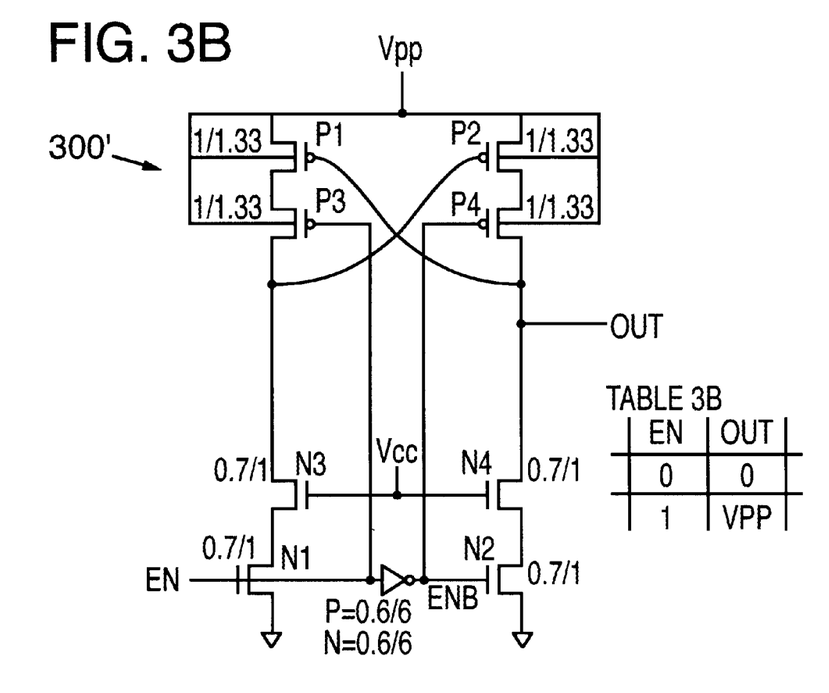
FIG. 3B is an electrical schematic diagram and logic table for the present invention as shown in FIG. 3, with n-well breakdown protection added.

FIG. 3B is an electrical schematic diagram and logic table, Table 3B, for an alternative embodiment of the present invention as shown in FIGS. 3 and 3A, a high voltage CMOS switch 300' with n-well breakdown protection added to the p-channel devices. The operation is essentially the same as that for FIGS. 3 and 3A. Separate n-wells are required. P1 and P2 are in the same n-well. This is used when Vpp is higher than the P+ to n-well junction breakdown; when (referring to FIG. 3A) when OUT is zero-volt and Vpp is greater than 13-volts.

Figure 4:
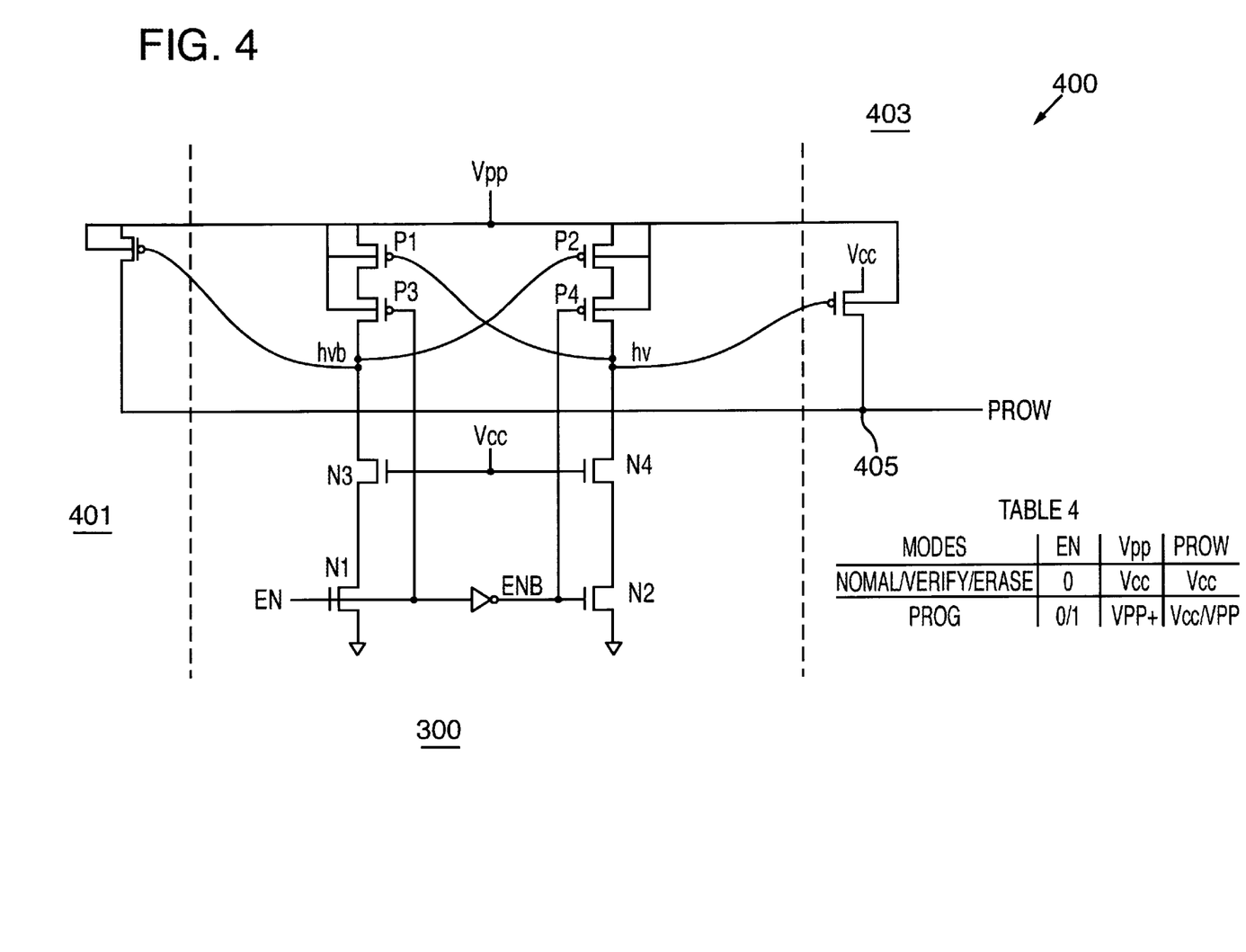
FIG. 4 is an electrical schematic diagram and logic table for the present invention implemented in a row decoder.

FIG. 4 is an electrical schematic diagram and logic table, Table 4 (where "or" is represented by a slash "/" mark), for the present invention implemented in a row decoder 400 for a row and column matrix of memory cells, e.g., a conventional electrically erasable and programmable read only memory (EEPROM or E$^2$PROM). The high voltage switch 300 is used between a known manner, row decoder, p-channel MOSFET input stage 401 and p-channel MOSFET output stage 403. In this implementation, the output signal is the row select signal, PROW. A high voltage signal (corresponding to nodes for OUT and OUTB signals in FIGS. 1–3B) is represented by signals HV with the inverted signal being HVB.

The output stage 403 couples Vcc to the appropriate row during a steady state condition of a non-volatile memory conventional operation and whenever that row is deselected. Norma/Verify/Erase of Table 4. Only during programming is the high voltage Vpp channeled to a selected row. In other words, when the enable signal En goes HIGH, signal HV goes to Vpp, the decoder output stage 403 is shut OFF. Signal HVB is grounded, so the decoder input stage 401 passes Vpp through as signal PROW at a row decoder output node 405. When signal En is LOW, with Vpp at the high voltage level greater than Vcc, node HV is at zero volts (grounded through the switch 300) and signal HVB is at Vpp, so the decoder input stage 401 is OFF and the decoder output stage 403 is ON, putting Vcc at the node 405 as signal PROW. Thus the output is switched between Vcc and Vpp (rather than LOW=zero volts and Vpp as in FIG. 3).

Figure 5:
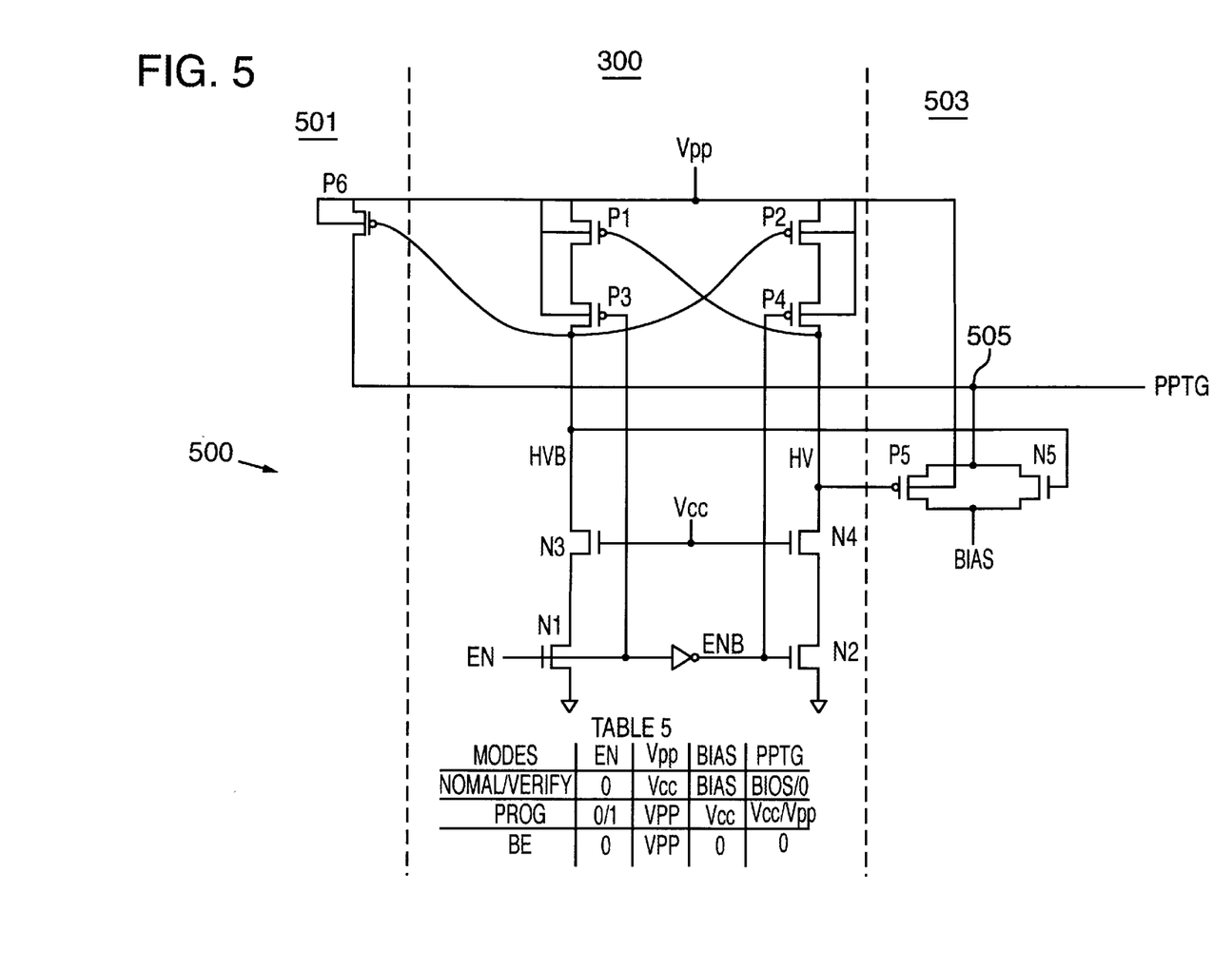
FIG. 5 is an electrical schematic diagram and logic table for the present invention implemented in a column decoder.

FIG. 5 is an electrical schematic diagram and logic table, Table 5, for the present invention implemented in a column decoder 500, generally used in conjunction with the row decoder 400 of FIG. 4. The high voltage switch 300 is used between a known manner column decoder, p-channel device, input stage 501 and p-channel and n-channel (P5 and N5) device output stage 503. In a non-volatile memory IC, a Bulk Erase, BE, mode is provided via the column decoding circuitry. As shown in Table 5, four output signals—zero

TABLE 3

| En | EnB | N1 | N2 | N3 | N4 | P1 | P2 | P3 | P4 | OutB | OUT |
|---|---|---|---|---|---|---|---|---|---|---|---|
| Low | Vcc | Off | On | On | Off | On | Off | On | Off | Vpp | Low |
| Vcc | Low | On | Off | Off | On | Off | On | Off | On | Low | Vpp | volts/LOW, Vcc, Vpp, and a BIAS level are needed at the column decoder output node 505, signal PPTG.

Turning ON the input stage 501 supplies Vpp to the output node 505 via the high voltage switch 300; HVB is at LOW, MOSFET N5 and MOSFET P5 are OFF, so that the path to the BIAS level is cut off; therefore HV is at Vpp and is passed on to column decoder output node 505.

When the enable signal En is LOW, HVB is at Vpp, shutting OFF the input stage 501. MOSFET N5 is turned ON. HV is grounded to zero volts. Grounding the gate at MOSFET P5 turns P5 ON. Therefore output stage 503 is a full CMOS switch acting as a pass gate for the BIAS level, or Vcc, or LOW/zero volts to the output node 505, seen as column decode signal PPTG. In other words, turning ON the output stage 503 supplies either the BIAS level or Vcc or zero-volts to the output node 505 depending upon current operation mode per known manner control circuitry.

Figure 6:
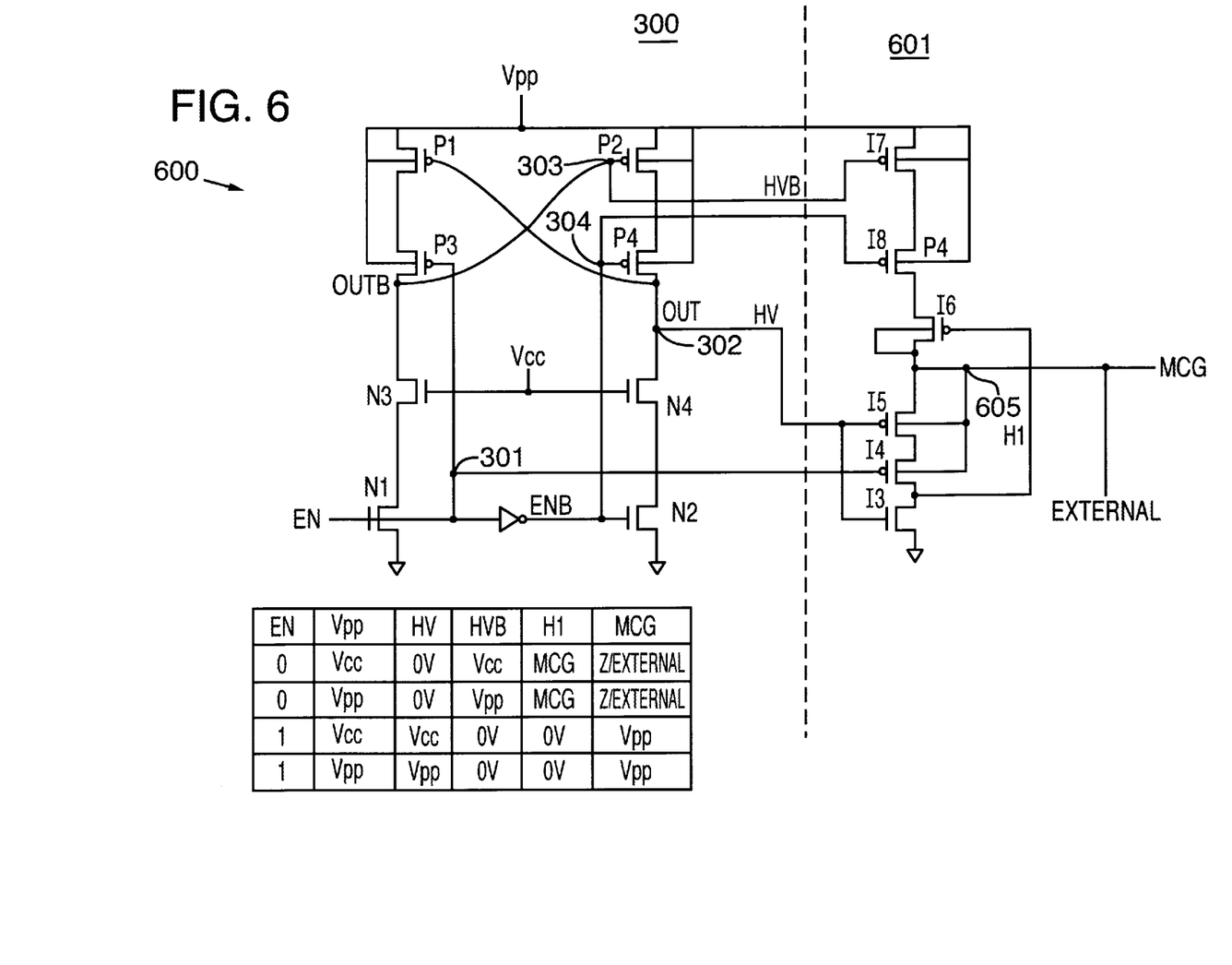
FIG. 6 is an electrical schematic diagram and logic table for the present invention implemented in a tri-state-able switch.

FIG. 6 is an electrical schematic diagram and logic table, Table 6, for the present invention implemented in a tri-state-able switch 600 circuit. The high voltage CMOS switch 300 has four nodes 301 (En), 302 (OUT), 303 (OUTB), 304 (EnB) for coupling signal inputs to a circuit output stage 601, which includes five stacked, p-channel MOSFETS I4, I5, I6, I7, I8 (I3 is a n-channel MOSFET). Table 5 provides the logic signal analysis for the available states.

The output "mcg" is used to bulk erase $E^2PROM$ cells. To bulk erase, Vpp of 13-volts is switched onto the mcg-node. When not in a bulk erase mode and in various other modes, other circuits can apply a bias voltage to the mcg-node via the "external" input. This circuit then acts as a high impedance circuit.

In essence, when the input signal En is LOW, output signal MCG on an output node 605 is Z-volts (also known in the art as "HIGH Z"). An externally supplied voltage, "external," drives it to a bias voltage or zero-volts. Output stage 601 MOSFETS I3, I4 and I5 form a cascoded high voltage inverter, preventing leakage during margin testing when "mcg" is taken HIGH externally. In this condition, HV is LOW, turning I3 OFF; therefore any HIGH voltage on mcg-node passes through on devices I5 and I4 to the gate of I6, shutting I6 Off and making the circuit look like a high impedance, HIGH-Z state, applying the proper gate voltage to a HIGH voltage state, viz., when input signal En is HIGH. Output stage 601 MOSFETS I7 and I8 form a grounded gate breakdown voltage cascode when En is HIGH and the output of the tristate switch is tied to high voltage input level Vpp. Output stage 601 MOSFET I6 prevents a forward bias during a slow MCG discharge compared to a Vpp discharge.

In operation then, when signal En is HIGH, Vcc, the high voltage CMOS switch reacts as explained with respect to FIGS. 3–3B, so therefore signal HV is HIGH and signal HVB is LOW. MOSFET I7 is ON. Output signal MCG is at the Vpp voltage level. The gate of 18 is tied to EnB which is LOW, therefore I8 is ON. Since HV is HIGH, MOSFET I5 is OFF, but MOSFETS I3 and I6 are ON. Therefore, MCG is tied to the Vpp level.

When En is LOW, EnB is HIGH, so HV is LOW and HVB is HIGH, shutting OFF MOSFET I7. The gate of MOSFET I8 is HIGH and is OFF. With MOSFETS I7 and I8 OFF, there is no path for voltage potential level Vpp to the output node 605. Node 605 and the output MCG is only tied to an external voltage, Z/external. When En is LOW, EnB is HIGH, so HV is LOW and HVB is HIGH, shutting OFF MOSFET I3 is OFF, MOSFET I5 In ON, MOSFET I4 is ON. MOSFETS I3 and I5 act as an inverter with MOSFET I4 cascode connecting them for grounded gate breakdown events. The n-wells of MOSFET I6, MOSFET I5 and MOSFET I4 gates are all tied together to the mcg-node to prevent junction forward bias.

The foregoing description of the preferred embodiment of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . ."

What is claimed is:

1. A high voltage CMOS switch comprising:
   first means for signal switching coupled to an input electrode, having a first logic state and a second logic state, and arranged as a parallel-connected, cascode input device and biased at a first electrical potential; and
   second means for signal switching, coupled to said first means and to a second electrical potential greater than said first electrical potential and to an output electrode, and arranged as a parallel-connected cascode output device coupled to said input electrode such that said second means is pre-biased to said first electrical potential such that switching occurs at the output from said first electrical potential to said second electrical potential without said first means being required to overdrive said second means.

2. The CMOS switch as set forth in claim 1, said first means and said second means further comprising:
   metal oxide semiconductor field effect transistors of approximately the same size.

3. The CMOS switch as set forth in claim 1, said first means further comprising:
   a first input stage having
      a first pair of series-connected, cascoded, MOSFETS of a first dopant channel type wherein a first one of said first pair is gate-coupled to the input electrode and a second one of said second pair is gate-coupled to the first electrical potential; and
   a first output stage, in parallel with the first input stage, having a second pair of series-connected, cascoded, MOSFETS of the first dopant channel type wherein a first one of said second pair is gate-coupled to the first one of said first pair via an inverter device and a second one of said second pair is gate coupled to the first electrical potential.

4. The CMOS switch as set forth in claim 3, said second means further comprising:
   a second input stage having a first pair of series-connected, cascoded MOSFETS of a second dopant channel type a first one of said first pair is gate-coupled to the output electrode and a second one of said second pair is gate-coupled to the input electrode; and
   a second output stage, in parallel with the second input stage, having a second pair of series-connected, cascoded, MOSFETS of the second dopant channel type wherein a first one of said second pair is gate-coupled to the output of the inverter device and a second one of said second pair is gate coupled to a second output electrode.

5. A high voltage switch circuit device, comprising:
   an input node;
   a first output node;
   a second output node;

a first source of electrical potential level;

a second source of electrical potential level greater than the first source of electrical potential;

an inverter connected to the input node;

a first cascode, biased by said first source of electrical potential level, connected to said input node;

a second cascode biased by said first source of electrical potential, and connected in series via the inverter with the first cascode, the second cascode connected to said output node;

a third cascode, biased by a signal on the input node, connected in series with the first cascode, and connecting said second source of electrical potential level to said first output node;

a fourth cascode, biased by an output signal of the inverter, connected in series with the second cascode, and connecting said second source of electrical potential level to said second output node, wherein a transition of a signal level between a reference and a second state equal to said first source of electrical potential level on said input node causes a transition on said output node between said first source of electrical potential level and said second source of electrical potential level without said first cascode having to over-drive said third cascode and without said second cascode having to over-drive said fourth cascode.

6. The device as set forth in claim 5, comprising:

each said cascode including MOSFETS of substantially the same size.

7. The device as set forth in claim 5, comprising:

the first cascode is a first pair of series connected first-type-dopant MOSFETS with a first first-type-dopant MOSFET having a gate electrode connected to the input node and to the inverter input, a source electrode connected to a ground electrical potential and a drain electrode, and a second first-type-dopant MOSFET having a gate electrode connected to the first source of electrical potential level, a drain electrode connected to said second output node, and a source electrode connected to the drain electrode of the first first-type-dopant MOSFET.

8. The device as set forth in claim 7, comprising:

the second cascode is a second pair of series connected first type dopant MOSFETS with a third first-type-dopant MOSFET having a gate electrode connected to an output of the inverter, a source electrode connected to the ground electrical potential, and a drain electrode, and a fourth first-type-dopant MOSFET having a gate electrode connected to the first source of electrical potential level, a drain electrode connected to said first output node, and a source electrode connected to the drain electrode of the third first-type-dopant MOSFET.

9. The device as set forth in claim 8, comprising:

the third cascode is a third pair of series connected second-type-dopant MOSFETS with a first second-type-dopant MOSFET having a gate electrode connected to the output node, a source electrode connected to the second source of electrical potential level, a drain electrode, and a well of the first-type-dopant connected to the second source of electrical potential level, and a second second-type-dopant MOSFET having a gate electrode connect to the input node, a source electrode connected to the drain electrode of the first second-type-dopant MOSFET, a drain electrode connected to the second output node, and a well of the first-type-dopant connected to the second source of electrical potential level.

10. The device as set forth in claim 9, comprising:

the fourth cascode is a fourth pair of series connected second-type-dopant MOSFETS with a third second-type-dopant MOSFET having a gate electrode connected to the second output node, a source electrode connected to the second source of electrical potential level, a drain electrode, and a well of the first-type-dopant connected to the second source of electrical potential level, and a fourth second-type-dopant MOSFET having a gate electrode connected to the inverter output node, a source electrode connected to the drain electrode of the third second-type-dopant MOSFET, and a drain electrode connected to the first output node.

11. The device as set forth in claim 5, further comprising:

the device is a high voltage switch for an integrated circuit memory row decoder circuit.

12. The device as set forth in claim 5, further comprising:

the device is a high voltage switch for an integrated circuit memory column decoder circuit.

13. The device as set forth in claim 5, further comprising:

the device is a tri-state-able high voltage switch for an integrated circuit memory decoder circuit.

14. In an integrated circuit memory decoder circuit, a high voltage switch device comprising:

first means for signal switching coupled to an input electrode, having a first logic state and a second logic state, and arranged as a parallel-connected, cascode input device and biased at a first electrical potential; and second means for signal switching, coupled to said first means and to a second electrical potential greater than said first electrical potential and to an output electrode, and arranged as a parallel-connected cascode output device coupled to said input electrode such that said second means is pre-biased to said first electrical potential such that switching occurs at the output from said first electrical potential to said second electrical potential without said first means being required to over-drive said second means.

15. A high voltage switch circuit device, comprising:

an input node;

a first output node;

a second output node;

a first source of electrical potential level;

a second source of electrical potential level greater than the first source of electrical potential;

an inverter connected to the input node;

a first cascode, biased by said first source of electrical potential level, connected to said input node;

a second cascode biased by said first source of electrical potential, and connected in series via the inverter with the first cascode, the second cascode connected to said output node;

a third cascode, biased by a signal on the input node, connected in series with the first cascode, and connecting said second source of electrical potential level to said first output node;

a fourth cascode, biased by an output signal of the inverter, connected in series with the second cascode, and connecting said second source of electrical potential level to said second output node, wherein a transition of a signal level between a reference and a second state equal to said first source of electrical potential level on said input node causes a transition on said output node between said first source of electrical potential level and said second source of electrical potential level without said first cascode having to over-drive said third cascode and without said second cascode having to over-drive said fourth cascode;

the first cascode is a first pair of series connected first-type-dopant MOSFETS with a first first-type-dopant MOSFET having a gate electrode connected to the input node and to the inverter input, a source electrode connected to a ground electrical potential and a drain electrode, and a second first-type-dopant MOSFET having a gate electrode connected to the first source of electrical potential level, a drain electrode connected to said second output node, and a source electrode connected to the drain electrode of the first first-type-dopant MOSFET;

the second cascode is a second pair of series connected first type dopant MOSFETS with a third first-type-dopant MOSFET having a gate electrode connected to an output of the inverter, a drain electrode connected to the ground electrical potential, and a drain electrode, and a fourth first-type-dopant MOSFET having a gate electrode connected to the first source of electrical potential level, a drain electrode connected to said first output node, and a source electrode connected to the source electrode of the third first-type-dopant MOSFET; and the third cascode is a third pair of series connected second-type-dopant MOSFETS with a first second-type-dopant MOSFET having a gate electrode connected to the output node, a source electrode connected to the second source of electrical potential level, a drain electrode, and a well of the first-type-dopant connected to the second source of electrical potential level, and a second second-type-dopant MOSFET having a gate electrode connect to the input node, a source electrode connected to the drain electrode of the first second-type-dopant MOSFET, a drain electrode connected to the second output node, and a well of the first- type-dopant connected to the second source of electrical potential level.

16. The device as set forth in claim 15, comprising:

the fourth cascode is a fourth pair of series connected second-type-dopant MOSFETS with a third second-type-dopant MOSFET having a gate electrode connected to the second output node, a source electrode connected to the second source of electrical potential level, a drain electrode, and a well of the first-type-dopant connected to the second source of electrical potential level, and a fourth second-type-dopant MOSFET having a gate electrode connected to the inverter output node, a source electrode connected to the drain electrode of the third second-type-dopant MOSFET, and a drain electrode connected to the first output node.

17. A CMOS switch comprising:

first and second P-channel MOSFETs having their sources coupled to a first voltage and their gates coupled to receive complementary output signals;

third and fourth P-channel MOSFETs having their sources coupled, respectively, to the drains of the first and second P-channel MOSFETs and their gates coupled to receive complementary input signals;

a first N-channel MOSFET having its drain coupled to the drain of the third P-channel MOSFET and its gate coupled to receive the input signal received by the third P-channel MOSFET; and a second N-channel MOSFET having its drain coupled to the drain of the fourth P-channel MOSFET and its gate coupled to receive the input signal received by the fourth P-channel MOSFET.

18. The CMOS switch of claim 17 including:

a third N-channel MOSFET coupled between the third P-channel MOSFET and the first N-channel MOSFET; and a fourth N-channel MOSFET coupled between the fourth P-channel MOSFET and the second N-channel MOSFET.

19. The CMOS switch of claim 17 wherein the switch is implemented within a memory row decoder circuit.

20. The CMOS switch of claim 17 wherein the switch is implemented within a memory column decoder circuit.

21. The CMOS switch of claim 17 wherein the switch is implemented as a tri-state-able switch within a memory decoder circuit.

* * * * *

UNITED STATES PATENT AND TRADEMARK OFFICE
CERTIFICATE OF CORRECTION

PATENT NO.   : 6,370,071 B1
DATED        : April 9, 2002
INVENTOR(S)  : Lall et al.

It is certified that error appears in the above-identified patent and that said Letters Patent is hereby corrected as shown below:

Drawings,
Sheet 2, Fig. 3B, the drawing should appear as follows:

Signed and Sealed this

Third Day of September, 2002

Attest:

*Attesting Officer*

JAMES E. ROGAN
*Director of the United States Patent and Trademark Office*